United States Patent
Park

(10) Patent No.: US 6,759,704 B2
(45) Date of Patent: Jul. 6, 2004

(54) METHOD FOR FABRICATING SEMICONDUCTOR DEVICE, AND SEMICONDUCTOR DEVICE, HAVING STORAGE NODE CONTACT PLUGS

(75) Inventor: Byung Jun Park, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/334,783

(22) Filed: Jan. 2, 2003

(65) Prior Publication Data

US 2003/0162353 A1 Aug. 28, 2003

Related U.S. Application Data

(62) Division of application No. 10/107,161, filed on Mar. 28, 2002, now Pat. No. 6,528,368.

(30) Foreign Application Priority Data

Feb. 26, 2002 (KR) ......................................... 2002-10205

(51) Int. Cl.[7] ........................................... H01L 21/8242
(52) U.S. Cl. ...................... 257/306; 257/296; 257/300; 257/311
(58) Field of Search .................... 257/296, 300, 257/303, 304, 306, 311, E21.648, E21.649

(56) References Cited

U.S. PATENT DOCUMENTS

| 5,330,614 | A |   | 7/1994  | Ahn ............................ 438/396 |
| 5,545,585 | A |   | 8/1996  | Wang et al. ................. 438/397 |
| 5,631,185 | A |   | 5/1997  | Kim et al. ................... 438/397 |
| 5,763,306 | A | * | 6/1998  | Tsai ............................ 438/255 |
| 5,933,724 | A | * | 8/1999  | Sekiguchi et al. .......... 438/239 |
| 6,001,683 | A |   | 12/1999 | Lee ............................. 438/241 |
| 6,194,309 | B1 |  | 2/2001  | Jin .............................. 438/639 |
| 6,215,187 | B1 |  | 4/2001  | Ooto et al. .................. 257/758 |
| 6,228,762 | B1 |  | 5/2001  | Park ............................ 438/639 |
| 6,239,022 | B1 |  | 5/2001  | Seo et al. .................... 438/629 |
| 2001/0012688 | A1 | | 8/2001 | Kawaguchi et al. ........ 438/637 |
| 2002/0027288 | A1 | | 3/2002 | Lee et al. .................... 257/758 |

FOREIGN PATENT DOCUMENTS

| JP | 10270555   | 10/1998 |
| JP | 11168197 A | 6/1999  |
| KR | 2002-2680  | 1/2002  |

OTHER PUBLICATIONS

Korean Patent Office, Notice to Submit Response, dated Dec. 29, 2003 (wherein the above references were cited).

* cited by examiner

*Primary Examiner*—Minhloan Tran
*Assistant Examiner*—Thomas L Dickey
(74) *Attorney, Agent, or Firm*—Volentine Francos, PLLC

(57) ABSTRACT

A method for fabricating a semiconductor device, and a semiconductor device, having storage node contact plugs whereby by a first interlayer dielectric layer (ILD) film having a greater etch rate is formed on a surface of a structure, and then a second ILD film having a smaller etch rate is formed on the first ILD film. After storage node contact holes having narrow width are formed by dry etching the ILD films, the width is increased by wet etching the ILD films. Since the first ILD film has a greater etch rate and is etched faster than the second ILD film, the lower width of each of the storage node contact holes is increased relatively more than the upper width. Insulating layer spacers are then formed on the internal walls of the storage node contact holes, and storage node contact plugs are formed by burying a conductive material therein.

20 Claims, 12 Drawing Sheets

METHOD FOR FABRICATING SEMICONDUCTOR DEVICE, AND SEMICONDUCTOR DEVICE, HAVING STORAGE NODE CONTACT PLUGS

CROSS REFERENCE TO RELATED APPLICATIONS

This is a divisional application of application Ser. No. 10/107,161, filed Mar. 28, 2002 now U.S. Pat. No. 6,528,368, which is hereby incorporated by reference in its entirety for all purposes.

The present invention claims priority under 35 U.S.C. §119 to Korean Application No. 02-10205 filed on Feb. 26, 2002, which is hereby incorporated by reference in its entirety for all purposes.

BACKGROUND OF THE INVENTION

1. Field of the Invention

The present invention relates to a method for fabricating a semiconductor device, and a semiconductor device, and more particularly to a method for fabricating a semiconductor device, and a semiconductor device, having storage node contact plugs.

2. Description of the Related Art

In a dynamic random access memory (DRAM), which is a semiconductor device having a capacitor over bit-line (COB) structure in which capacitors are formed after bit lines are formed, storage node contact holes for forming storage node contact plugs are formed between narrow bit lines, and thus the size of the storage node contact holes is small. In addition, the storage node contact holes must be formed by deeply etching an interlayer dielectric (ILD) film, and thus it is very difficult to form the storage node contact holes. In particular, a highly developed alignment technique is required during a photolithographic process. Since the alignment margin is less than 30 nm in a process having a design rule less than 0.15 µm, it is very difficult to form the storage node contact holes so that the same design rule is obtained in every process.

In order to form the storage node contact holes so that same design rule is obtained in every process, a process of forming self-aligned contact holes has been suggested. In the process of forming self-aligned contact holes, an ILD film having different etch selectivity with respect to a silicon nitride layer is etched after bit lines are covered with the silicon nitride layer, to thereby form storage node contact holes that are self-aligned in the silicon nitride layer. However, since the silicon nitride layer becomes thinner as the design rule becomes smaller, the occurrence of shorts between a storage node contact plug and a bit line increases as the thickness of the silicon nitride layer approaches zero.

As the aspect ratio of the storage node contact holes becomes larger, the storage node contact holes are not completely formed (or so-called not-open), or the width of the storage node contact holes becomes smaller in the lower portions of the storage node contact holes to thus be tapered. In either case, contact area between the storage node contact plugs and conductive regions under the storage node contact plugs (such as cell pads) becomes smaller, and thus contact resistance is greatly increased.

SUMMARY OF THE INVENTION

The present invention is thus directed to a method for fabricating a semiconductor device, and a semiconductor device, having storage node contact plugs, which substantially overcome one or more of the problems due to the limitations and disadvantages of the related art.

To solve the above problems, it is an object of the present invention to provide a method for fabricating a semiconductor device, and a semiconductor device, whereby storage node contact plugs are formed so that the occurrence of shorts between the storage node contact plugs and bit lines are greatly reduced and sufficient contact area between the storage node contact plugs and cell pads is obtained.

Accordingly, to achieve the above object, there is provided a method for fabricating a semiconductor device, including forming bit lines on a semiconductor substrate on which cell pads are formed, the cell pads being separated from each other by an insulating layer; forming a bit line protection layer on an entire surface of the semiconductor substrate having the bit lines formed thereon, the bit line protection layer having a thickness so that the bit lines are not buried; forming a first interlayer dielectric (ILD) film on the bit line protection layer, the first ILD film having a flat top and a thickness which is equal to or greater than a height of the bit lines; forming a second ILD film on the first ILD film; the second ILD film having a wet etch rate smaller than a wet etch rate of the first ILD film; forming storage node contact holes having narrow width by dry etching the second and first ILD films between the bit lines, the storage node contact holes exposing the cell pads; increasing the width of the storage node contact holes by wet etching the second and first ILD films, so that a lower width of each of the storage node contact holes is increased relatively more than an upper width of each of the storage node contact holes in view of the wet etch rates of the first and second ILD films; forming insulating layer spacers on internal walls of the storage node contact holes; and forming separated storage node contact plugs by burying a conductive material in the storage node contact holes in which the insulating layer spacers are formed.

The second ILD film is formed as having a thickness smaller than that of the first ILD film.

The first ILD film is formed of an insulating material in which impurities are doped with a first concentration, and the second ILD film is formed of the insulating material in which impurities are doped with a second concentration lower than the first concentration. The impurities are selected from the group consisting of boron (B) and phosphor (P). The insulating material may be an oxide in which the impurities are doped. The impurity-doped insulating material may be boron silicate glass (BSG), phosphorus silicate glass (PSG), or boron phosphorus silicate glass (BPSG).

The first ILD film may be formed of BSG, PSG, or BPSG, and the second ILD film may be formed of tetra ethyl ortho silicate (TEOS), or an oxide that is formed by high density plasma-chemical vapor deposition (HDP-CVD).

The first ILD film is etched using the bit line protection layer as an etch stopper, whereby the lower width of each of the storage node contact holes is increased. The forming of the first ILD film includes forming an insulating layer as having a thickness larger than the height of the bit lines to bury the bit lines on the semiconductor substrate on which the bit line protection layer is formed, and chemical mechanical polishing the insulating layer using the bit line protection layer as an etch stopper.

The bit line protection layer is formed of silicon nitride. The bit lines are formed by sequentially stacking a bit line conductive layer and a capping layer.

The first ILD film is formed as having a thickness larger than the height of the bit lines, and the second ILD film is completely removed during forming of the insulating layer spacer.

The forming of the insulating layer spacer includes forming an insulating layer for spacing on an entire surface of the semiconductor device after said increasing the width of the storage node contact holes, the insulating layer for spacing having a thickness so that the storage node contact holes are not buried; and anisotropically etching the insulating layer for spacing while protecting the first ILD film and the insulating layer for spacing formed on sidewalls of the first ILD film, so that the insulating layer for spacing remains only on the internal walls of the storage node contact holes, the upper width of each of the storage node contact holes being relatively narrower than the lower width of each of the storage node contact holes, so that the second ILD film overhangs the first ILD film and the insulating layer for spacing formed on the sidewalls of the first ILD film, to protect the first ILD film and the insulating layer for spacing during said anisotropically etching. In a case where the first ILD film is formed as having a thickness larger than the height of the bit lines, the second ILD film is completely removed during anisotropically etching the insulating layer for spacing.

The forming of the storage node contact plugs includes depositing the conductive material on an entire surface of the semiconductor device after said forming insulating layer spacers, so that the storage node contact holes on which the insulating layer spacers are formed are completely buried; and planarizing a top surface of the semiconductor device after said depositing the conductive material, until the second ILD film is exposed. In a case where the first ILD film is formed to a thickness larger than the height of the bit lines, the second ILD film is completely removed during planarizing the top of the resultant structure on which the conductive material is deposited.

In order to achieve the above objects, there is also provided a semiconductor device including a substrate having cell pads formed thereon, the cell pads being separated from each other by insulation material; bit lines disposed on the substrate; a bit line protection layer disposed on an entire surface of the semiconductor device including the bit lines and the substrate, the bit line protection layer having a thickness so that the bit lines are not buried; a first interlevel dielectric (ILD) layer disposed on the bit line protection layer, the first ILD layer having a thickness such that areas between the bit lines are buried and the bit line protection layer on top surfaces of the bit lines are exposed; a second interlevel dielectric (ILD) layer disposed on the first ILD layer and the exposed bit line protection layer; storage node contact holes disposed in between the bit lines through the second and first ILD layers and the bit line protection layer to the cell pads, a lower width of the storage node contact holes through the first ILD layer being greater than an upper width of the storage node contact holes through the second ILD layer; and a conductive material buried within the storage node contact holes.

According to the present invention, the occurrence of shorts between storage node contact plugs and bit lines may be greatly reduced and sufficient contact area between storage node contact plugs and cell pads is obtained, so that increases in contact resistance can be effectively prevented. Since the upper width of each of the storage node contact holes is relatively narrower than the lower width of each of the storage node contact holes, the first ILD film and the insulating layer for spacing that is formed on the sidewall of the first ILD film can be protected during anisotropic etching of the insulating layer for spacing that forms the insulating layer spacer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
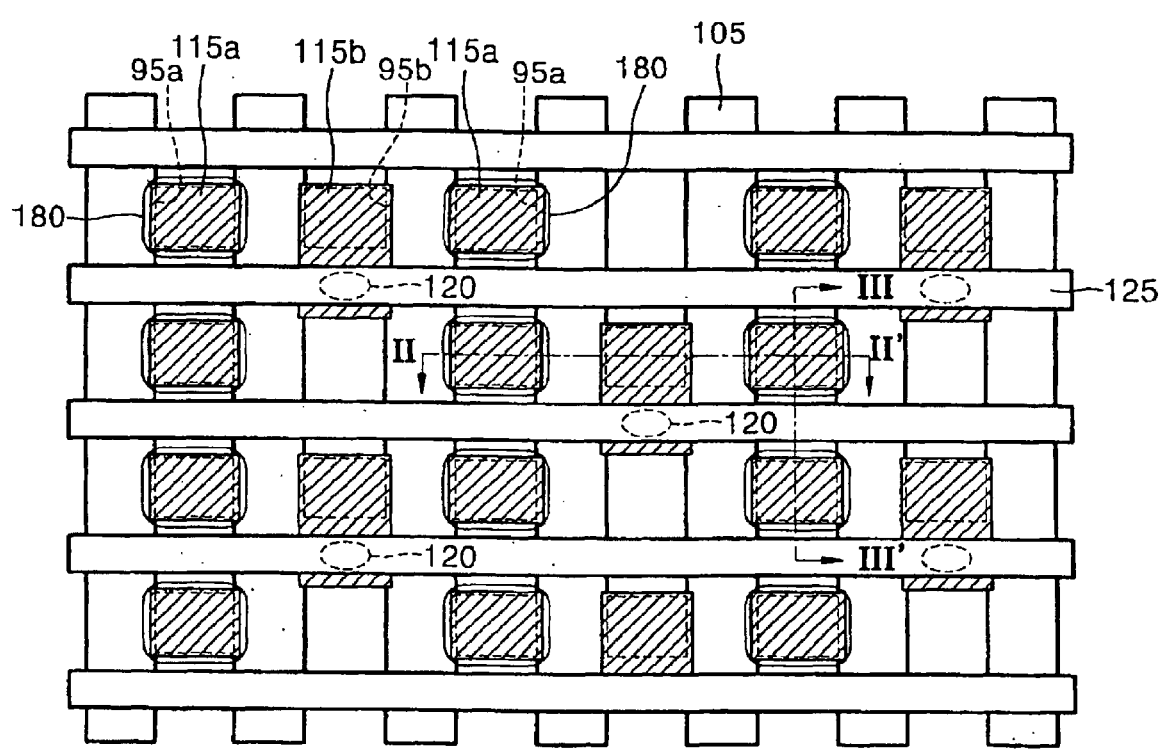
FIG. 1 is a layout diagram of a DRAM having a capacitor over bit-line (COB) structure of the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. Like reference numerals refer to like elements throughout the drawings. It will be understood that when a layer is referred to as being on another layer or "on" a semiconductor substrate, it can be directly on the other layer or on the semiconductor substrate, or intervening layers may also be present.

FIG. 1 is a layout diagram of a DRAM having a capacitor over bit-line (COB) structure according to embodiments of the present invention. In the structure, the sources and drains are respectively denoted as 95a and 95b, the gates are denoted as 105, the cell pads are denoted as 115a and 115b, the bit lines are denoted as 125, and the storage node contact plugs are denoted as 180. Hereinafter, a first embodiment of the present invention will be described with reference to FIGS. 2A through 2H which are cross-sectional views taken along line II—II of FIG. 1, and FIGS. 3A through 3H which are cross-sectional views taken along line III—III of FIG. 1.

Figure 2A:
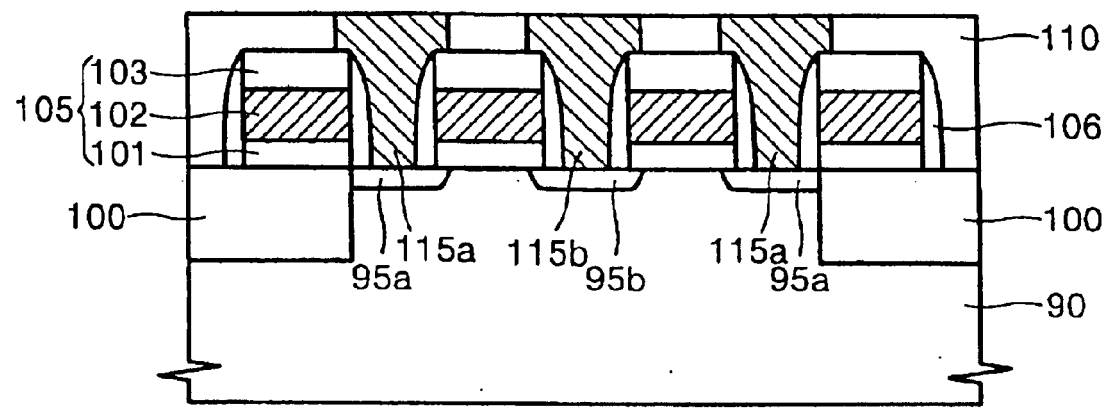
FIGS. 2A through 2H are cross-sectional views taken along line II—II of FIG. 1, which illustrate the structure at intermediate process steps according to a first embodiment of the present invention.
Figure 3A:
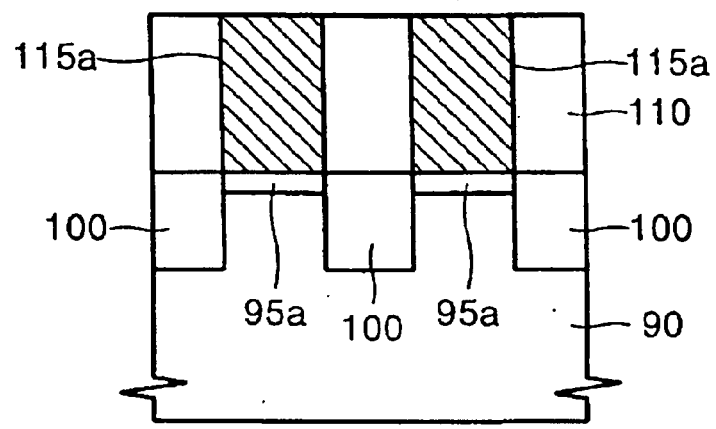
FIGS. 3A through 3H are cross-sectional views taken along line III—III of FIG. 1, which illustrate the structure at intermediate process steps according to the first embodiment of the present invention.

Referring to FIGS. 2A and 3A, shallow trench isolation 100 for defining an active region and an inactive region on a semiconductor substrate 90 is formed. Next, gates 105 are formed on the active region. In order to form the gates 105, a gate oxide layer 101 is first formed on the semiconductor substrate 90, and a gate conductive layer 102 and a mask nitride layer 103 are stacked on the gate conductive layer 101 in order. A polysilicon layer may be formed as the gate conductive layer 102 at a temperature of 500–700° C. through low pressure chemical vapor deposition (LPCVD). After the polysilicon layer is formed in a non impurity-doped state, conductivity may be obtained by doping the polysilicon layer with arsenic (As) or phosphor (P) through ion implantation. As an alternative, the polysilicon layer may be formed in an impurity-doped state by in-situ doping with impurities during a deposition process. As a further alternative, a metal layer such as a tungsten (W) layer may be formed as the gate conductive layer 102 in order to provide improved conductivity, whereby silicide of the tungsten may be formed. Subsequently, the mask nitride layer 103, the gate conductive layer 102, and the gate oxide layer 101 are continuously patterned in order using a mask for forming the gates, so that the gates 105 shown in FIG. 2A are formed. After the mask for forming gates is removed, a silicon nitride layer is formed on the entire surface of the structure. The silicon nitride layer is etched back, to thereby form insulating layer spacers 106 on both sidewalls of the gates 105.

Subsequently, impurities are implanted into the entire surface of the semiconductor substrate 90, to thereby form sources 95a and drain 95b. The sources 95a and the drain 95b may be formed by a lightly doped drain (LDD) structure as occasion demands.

Thereafter, an insulating layer 110 such as an oxide layer for insulation between layers, is formed on the entire surface of the resultant structure in which the sources 95a and the drain 95b are formed. After that, the insulating layer 110 is planarized through chemical mechanical polishing (CMP). Next, the insulating layer 110 at both sides of the gates 105 is etched using a cell pad mask, until the sources 95a and the drain 95b are exposed, thereby forming contact holes for the cell pads. After the cell pad mask is removed, the contact holes for the cell pads are filled with a conductive material such as doped polysilicon for example. Subsequently, the conductive material is planarized through CMP so that the top of the conductive material is parallel with the insulating layer 110, thereby forming cell pads 115a and 115b that are electrically connected with the semiconductor substrate 90, that is to the sources 95a and the drain 95b. In this case, shorts between the gate conductive layer 102 and the cell pads 115a and 115b are prevented by the mask nitride layer 103 and the insulating layer spacer 106. The cell pads 115a and 115b are isolated from each other by the insulating layer 110. The cell pads 115a and 115b are formed at a region in which contact holes are to be formed, in order to reduce the aspect ratio of the contact holes to be later formed.

Figure 2B:
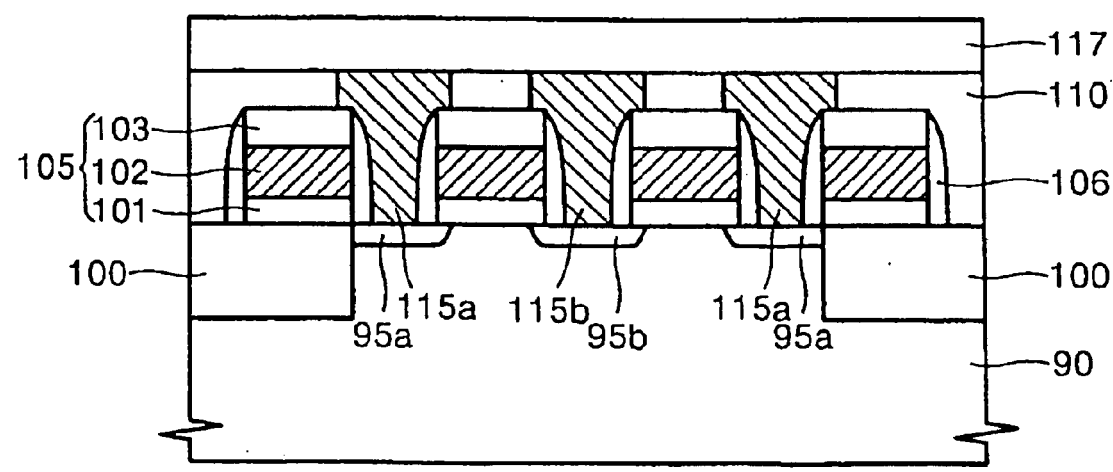
Figure 3B:
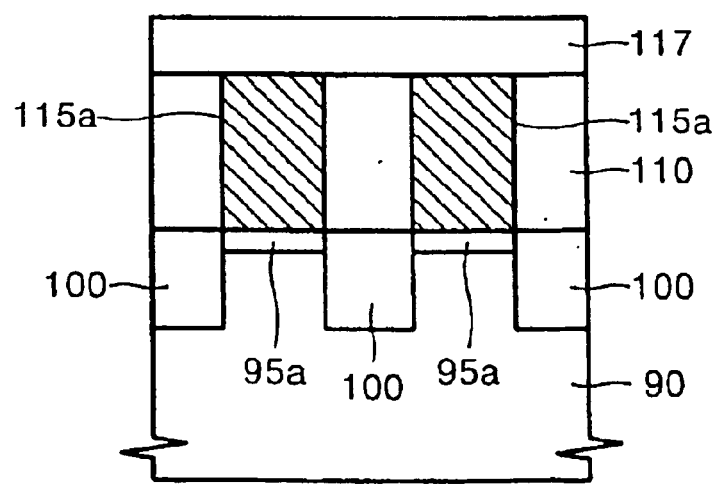

Referring to FIGS. 2B and 3B, after another insulating layer 117 such as an oxide layer is further formed on the entire surface of the resultant structure on which the cell pads 115a and 115b are formed, the insulating layer 117 is etched to form bit line contact holes therein that expose the cell pads 115b. Next, the bit line contact holes in the insulating layer 117 are buried with a conductive material, thereby forming bit line contact plugs (120 of FIG. 1) that will eventually be coupled to the bit lines 125.

Figure 2C:
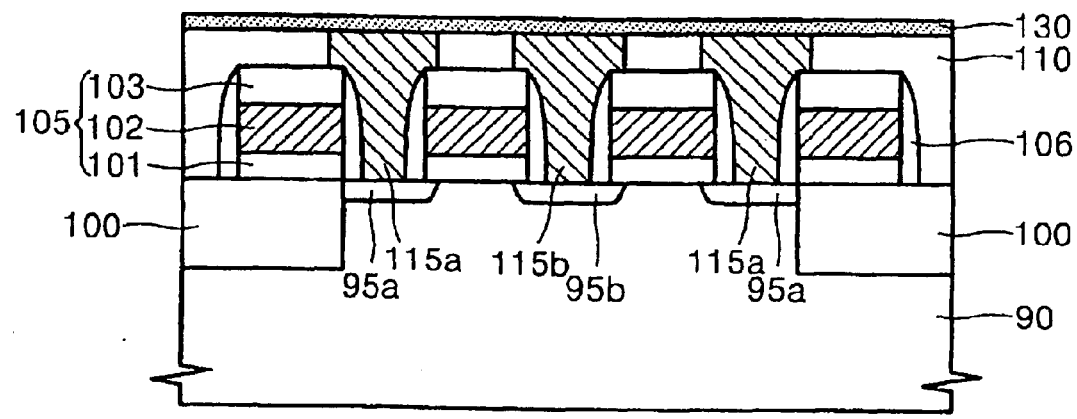
Figure 3C:
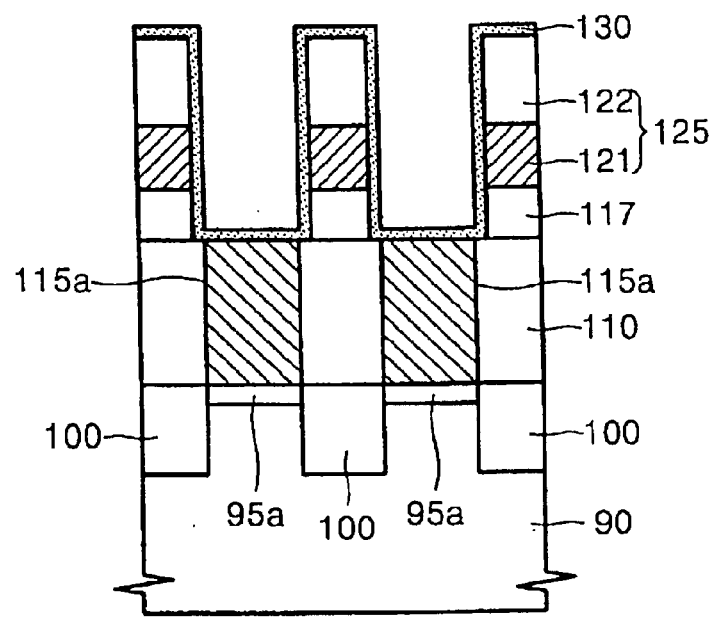

Referring to FIGS. 2C and 3C, bit lines 125 are formed on the bit line contact plugs (120 of FIG. 1). In particular, as shown in FIG. 3C, a bit line conductive layer 121 and a capping layer 122 are sequentially stacked on insulating layer 117, and then are patterned using a bit line mask, to thereby form the bit lines 125. When the bit line conductive layer 121 and the capping layer 122 are patterned, the insulating layer 117 around the patterned bit line conductive layer 121 is etched such that the cell pads 115a are exposed. The bit line conductive layer 121 may be formed of doped polysilicon, or may be formed of a double layer of doped polysilicon and silicide, or may be formed of metal such as tungsten (W). In a case where the bit line conductive layer 121 is formed of only metal, a diffusion prevention layer is further deposited before the bit line conductive layer 121 is formed. For example, a titanium nitride layer may be used as the diffusion prevention layer. Also, the capping layer 122 may be formed of silicon nitride.

After the bit line mask is removed, a bit line protection layer 130 is formed on the entire structure as having a thickness whereby the bit lines 125 are not buried. The thickness of the bit line protection layer 130 may be 50–150 Å. The bit line protection layer 130 is formed by depositing the silicon nitride layer at a temperature of 500–850° C. through LPCVD or plasma enhanced CVD (PECVD). The bit line protection layer 130 prevents the oxidation of the bit lines 125 during a subsequent oxidation process such as an oxidation process of a capacitor dielectric layer. The bit line protection layer 130 is also an etch stop for a first ILD film (140 of FIG. 2D) during a subsequent wet etching process of forming storage node contact holes. Since the bit line protection layer 130 is formed on both sidewalls and on the top surface of the bit lines 125, the bit line protection layer 130 is also used for electrical insulation of the storage node contact plugs (180 of FIG. 2H) and the bit lines 125.

Figure 2D:
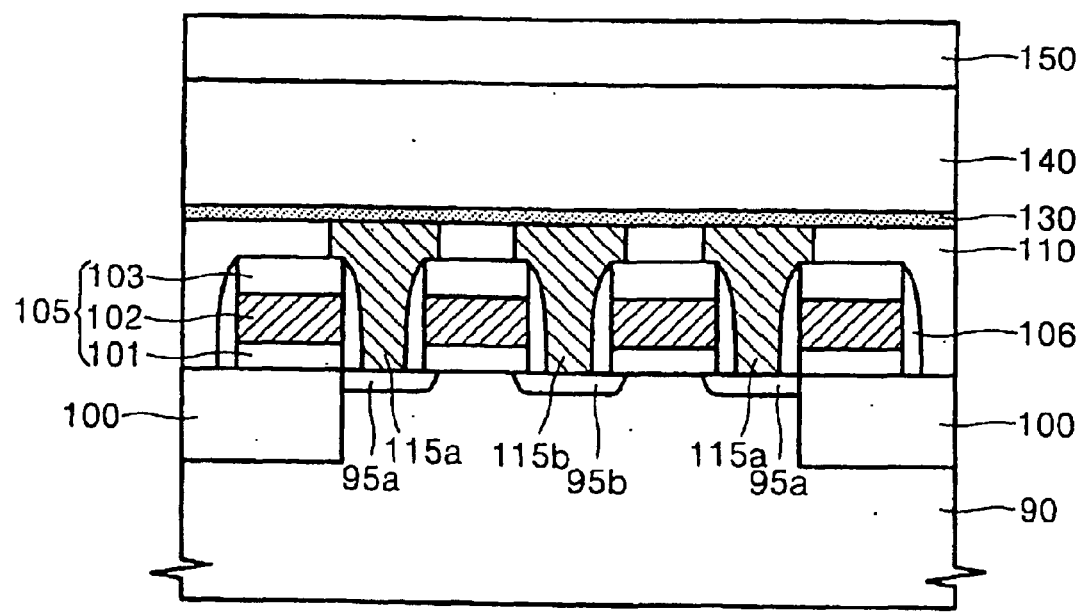
Figure 3D:
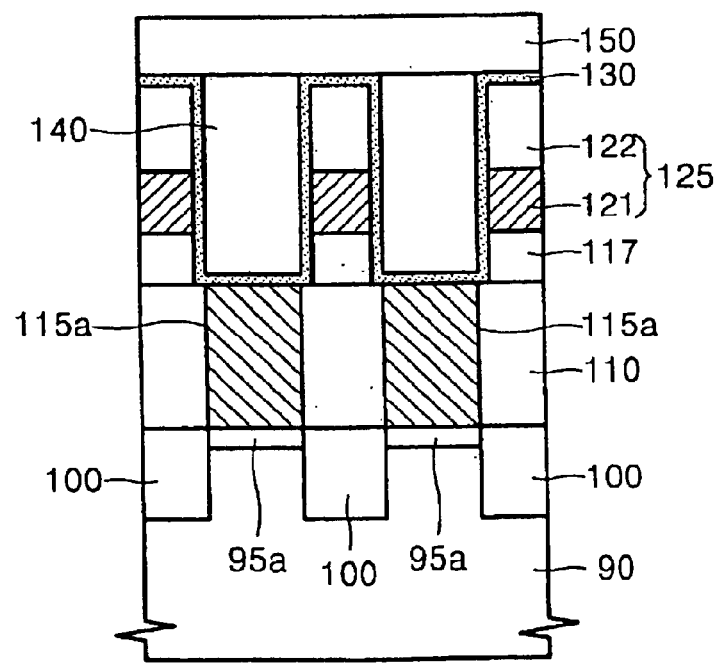

Referring to FIGS. 2D and 3D, a first ILD film 140 having a flat top is formed on the structure having the bit line protection layer 130 formed thereon, the first ILD film 140 having a thickness which is the same as the height of the bit lines 125. That is, the first ILD film 140 is formed to have a height parallel with or the same as the surface of the bit line protection layer 130 that is formed on the bit lines 125. To do this, after an insulating material is deposited or coated to a thickness greater than the height of the bit lines 125 having the bit line protection layer 130 thereon, the insulating material is chemical mechanical polished using the bit line protection layer 130 as an etch stopper. Subsequently, a second ILD film 150 having a wet etch rate smaller than that of the first ILD film 140, is formed on the first ILD film 140. The second ILD film 150 may be formed to a thickness smaller than that of the first ILD film 140.

The first ILD film 140 and the second ILD film 150 may be formed by combination of arbitrary ILD films having different etch rates. For example, ILD films having etch rate which is varied according to the concentration of doped impurities may be used as the first ILD film 140 and the second ILD film 150. That is, the first ILD film 140 may be formed using an insulating material in which impurities are doped with a first concentration. Oxides in which a material having a feature whereby the concentration of impurities such as boron (B) or phosphorus (P) is proportional to the etch ratio may be used as the insulating material forming the first ILD film 140. Thus, boron silicate glass (BSG), phosphorus silicate glass (PSG) or boron phosphorus silicate glass (BPSG) may be used as the insulating material forming the first ILD film 140. In a case where the first ILD film 140 is formed of BPSG, the first ILD film 140 is deposited through atmospheric pressure CVD (APCVD), LPCVD or PECVD. In such a case, the first concentration which is the doping concentration of boron (B) and phosphor (P), is as high as possible so that reflow of the ILD film is facilitated and an etch rate thereof during a subsequent wet etching process is large. After the first ILD film 140 is deposited, the first ILD film 140 is reflowed at a high temperature of 750–900° C. under a nitrogen atmosphere or under an atmosphere of nitrogen and oxygen. Subsequently, the top of the first ILD film 140 is planarized through CMP.

The second ILD film 150 is then formed on the first ILD film 140 of the resultant structure using an insulating material in which impurities are doped with a second concentration lower than the first concentration. In a case where the second ILD film 150 is formed of BPSG, the second ILD film 150 is deposited through APCVD, LPCVD or PECVD. After the second ILD film 150 is deposited, a reflow process using a conventional high thermal treatment, an etch back process, or a CMP process is performed, thereby planarizing the second ILD film 150.

It is to be understood that materials having essentially different etch rates may be used as the first and second ILD films 140 and 150, instead of using ILD films in which etch rate is varied according to the concentration of doped impurities. For example, the first ILD film 140 may be formed of BSG, PSG, or BPSG, and the second ILD film 150 may be formed of tetra ethyl ortho silicate (TEOS) or an oxide that is formed through high density plasma (HDP)-CVD.

Figure 2E:
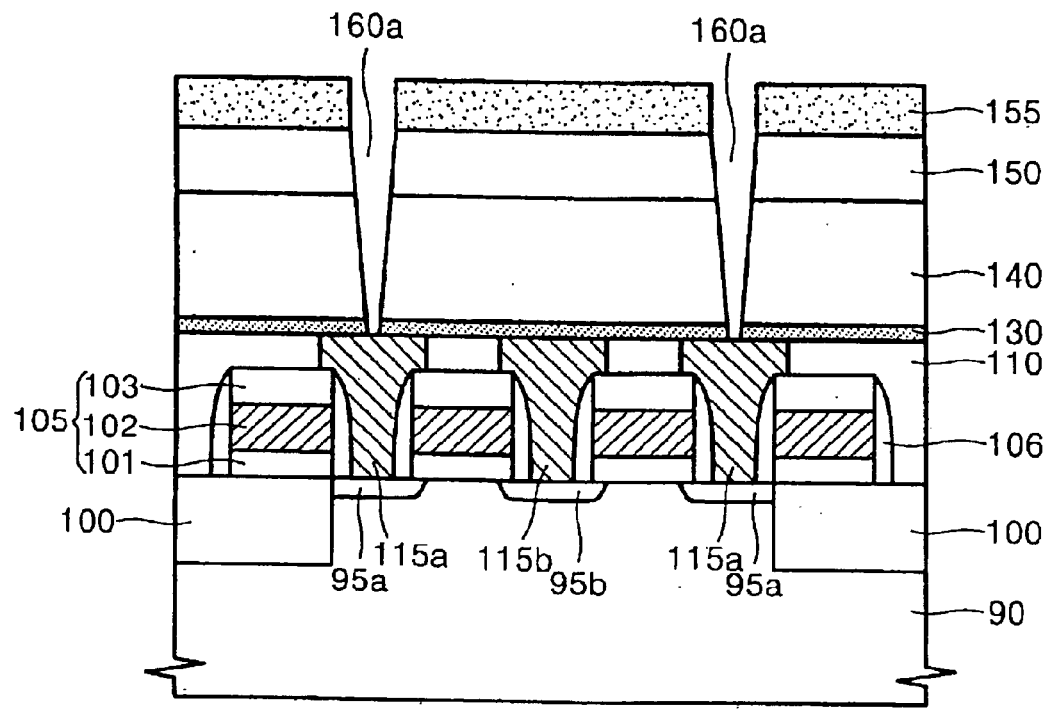
Figure 3E:
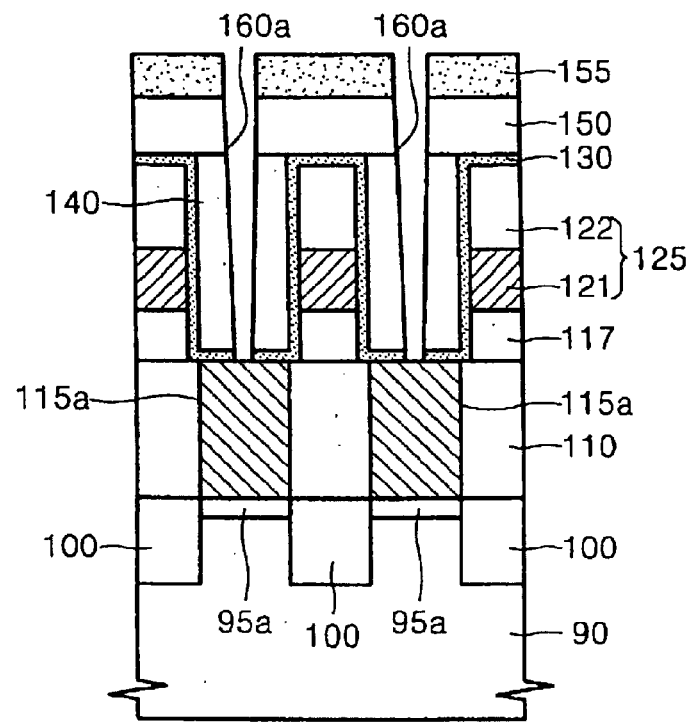

Referring to FIGS. 2E and 3E, after a photoresist layer is formed on the second ILD film 150, a photoresist pattern 155 for defining openings for exposing cell pads 115a is formed through a photolithographic process, the cell pads 115a being in contact with sources 95a. Subsequently, the second and first ILD films 150 and 140, and the bit line protection layer 130 are continuously etched in order, through a dry etching process such as reactive ion etching (RIE), using the photoresist pattern 155 as an etching mask, to thereby form storage node contact holes 160a having narrow width exposing the cell pads 115a. The storage node contact holes 160a are formed in the second and first ILD films 150 and 140, and thereby the width of the storage node contact holes 160a becomes narrower in the lower end of the storage node contact holes 160a due to the large aspect ratio of the storage node contact holes 160a.

Figure 2F:
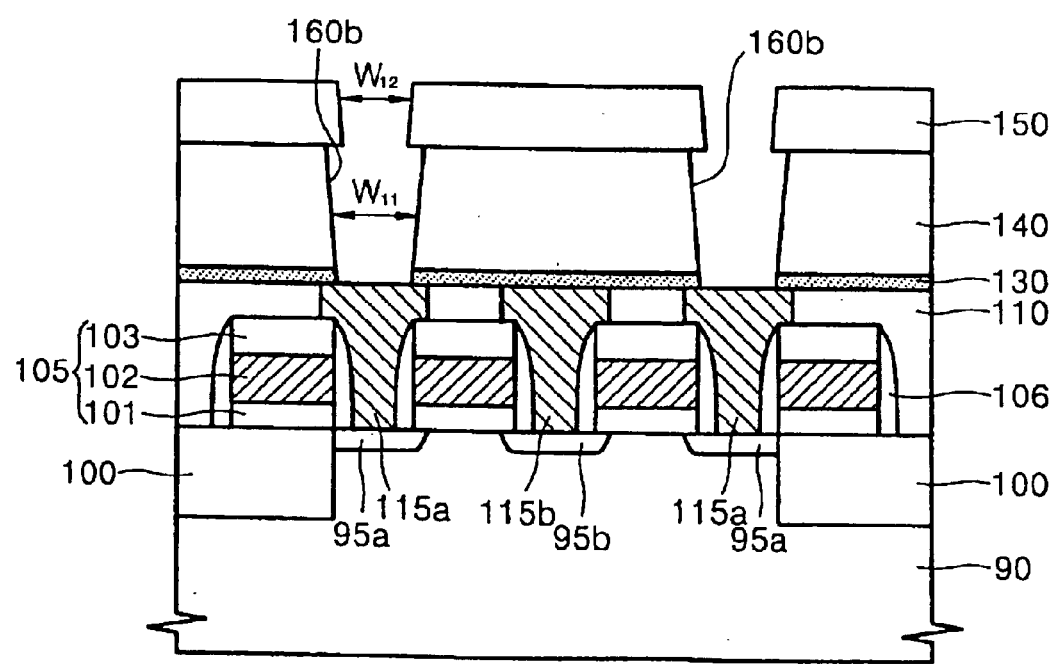
Figure 3F:
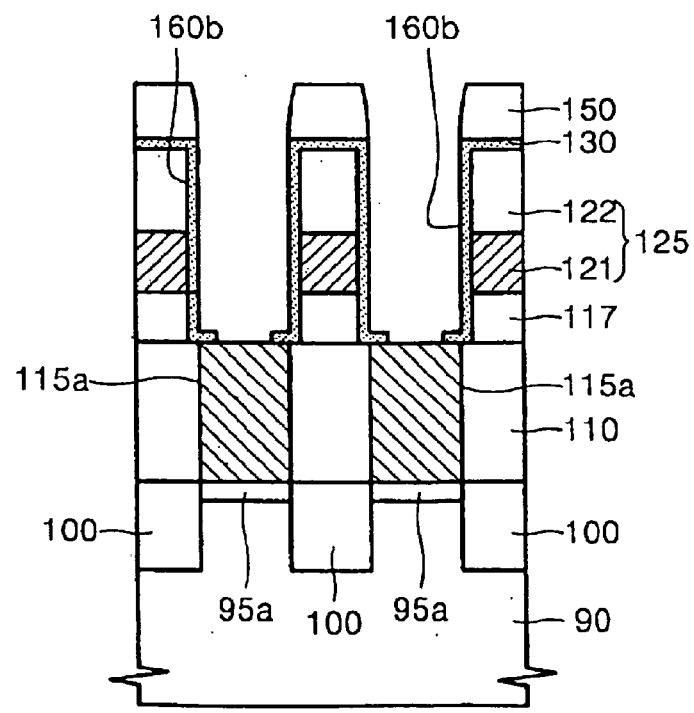

Referring to FIGS. 2F and 3F, after the photoresist pattern 155 is removed, a wet etching process is performed on the resultant structure in which the storage node contact holes 160a are formed, using a mixture of ammonia ($NH_4OH$), hydrogen peroxide ($H_2O_2$) and deionized water, or hydrofluoric acid (HF) solution. As a result, while the second and first ILD films 150 and 140 are wet-etched, the width of the storage node contact holes 160a is increased. However, since the etch rate of the first ILD film 140 is greater than that of the second ILD film 150, the lower width of each of storage node contact holes 160b is increased relatively more than the upper width of each of the storage node contact holes 160b, so that $W_{11}$ is greater than $W_{12}$.

However, even though the lower width $W_{11}$ of the storage node contact holes 160b is increased as illustrated in FIG. 2F, shorts between the conductive material which is to be formed in the storage node contact holes 160b and the adjacent cell pads 115b may be prevented by the bit line protection layer 130 which is used as an etch stopper. By increasing the lower width $W_{11}$ of each of the storage node contact holes 160b, a contact area between the conductive material which is to be formed in the storage node contact holes 160b and the lower cell pads 115a may be increased. Even though the lower width $W_{11}$ of each of the storage node contact holes 160b is increased to a desired lower width, the etch rate of the second ILD film 150 is smaller than that of the first ILD film 140, and thus the upper width $W_{12}$ of each of the storage node contact holes 160b is not excessively increased. As a result, conductive materials that are to be buried in the adjacent storage node contact holes 160b are prevented from bridging.

Figure 2G:
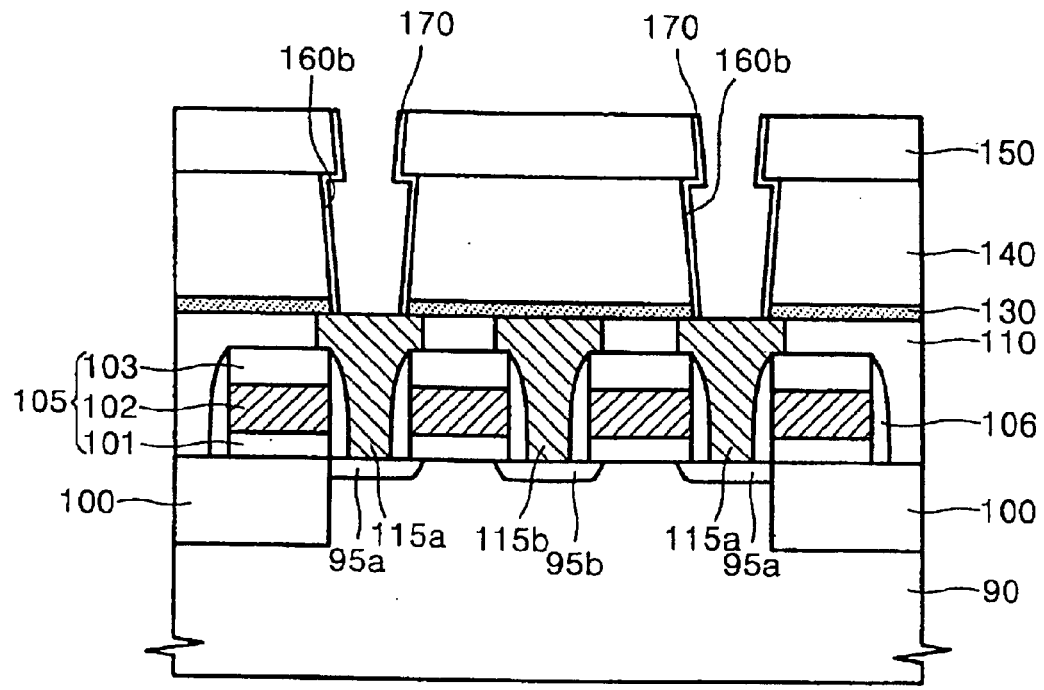
Figure 3G:
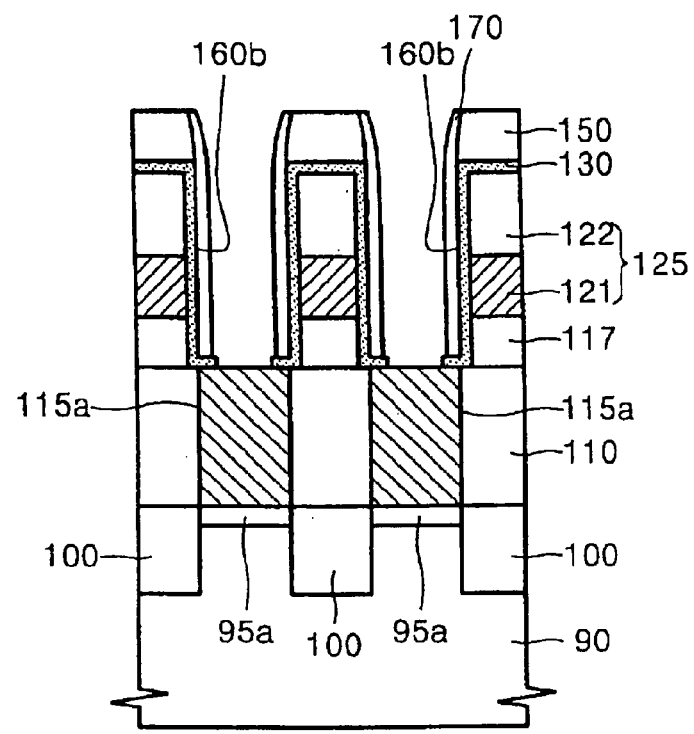

Referring to FIGS. 2G and 3G, an insulating layer for spacing is formed on the entire surface of the resultant structure as having a thickness whereby the storage node contact holes 160b are not buried. A layer having high step coverage may be used as the insulating layer for spacing. For example, a nitride layer may be formed to a thickness of 100–500 Å. Next, anisotropic etching such as an etch back is performed, to thereby form insulating layer spacers 170 on the internal walls of the storage node contact holes 160b. As shown in FIG. 2F, the upper width $W_{12}$ of each of the storage node contact holes 160b is relatively narrower than the lower width $W_{11}$ of each of the storage node contact holes 160b. Due to the narrower width $W_{12}$ of the storage node contact holes 160b at the second ILD film 150, the first ILD film 140 and the insulating layer for spacing that is formed on the sidewalls of the first ILD film 140 cannot be seen from the top of the resultant structure. That is, the second ILD film 150 shadows or overhangs the first ILD film 140 and the insulating layer for spacing that is formed on the sidewalls of the first ILD film 140. Thus, when the insulating layer for spacing is anisotropically etched for formation of the insulating layer spacers 170, the first ILD film 140 and the insulating layer for spacing that is formed on the sidewalls of the first ILD film 140 are protected from etching.

Figure 2H:
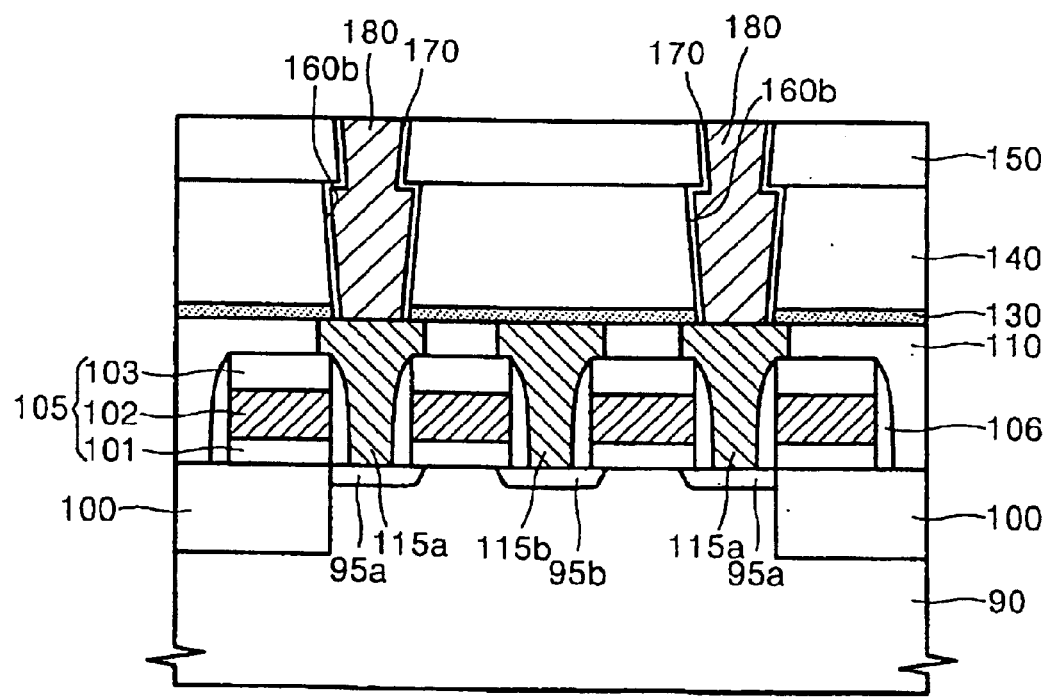
Figure 3H:
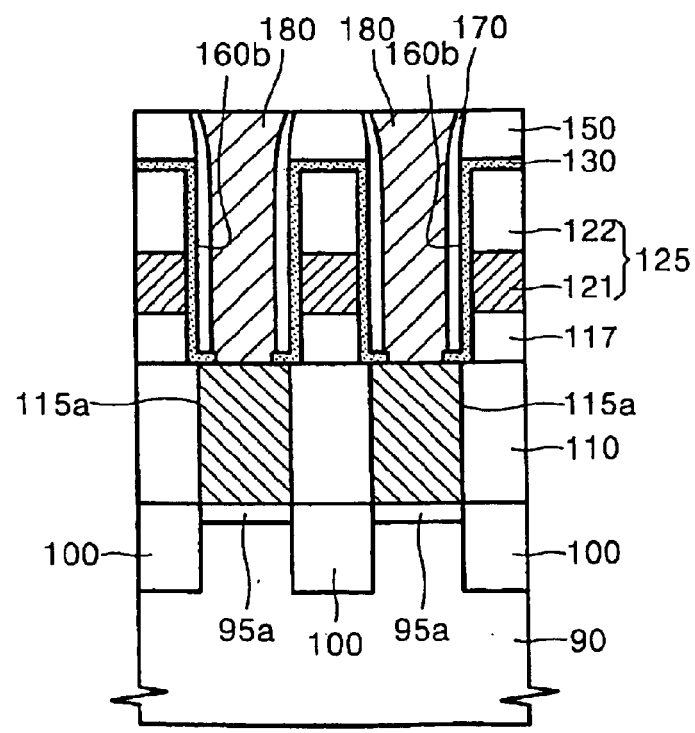

Referring to FIGS. 2H and 3H, storage node contact plugs 180 that are separated from one another are formed by burying a conductive material in the storage node contact holes 160b. For this purpose, a conductive layer such as an impurity doped polysilicon layer having a predetermined thickness is deposited on the structure to bury the storage node contact holes 160b. The conductive layer may be deposited to a thickness of 1000–5000 Å on the resultant structure on which the insulating layer spacers 170 are formed. The conductive layer is also deposited to a predetermined thickness on the second ILD film 150. Next, the top of the conductive layer is planarized through etch back or CMP, and the conductive layer on the second ILD film 150 is removed, and the top of the second ILD film 150 is exposed, thereby forming the separated storage node contact plugs 180.

As described above, according to a first embodiment of the present invention, shorts between the storage node contact plugs 180 and the bit lines 125 may be prevented from occurring, and sufficient contact areas between the storage node contact plugs 180 and the cell pads 115a can be obtained. Bridges between the adjacent storage node contact plugs 180 can also be prevented. In view of the characteristics that the second ILD film 150 shadows or overhangs the first ILD film 140 and the insulating layer for spacing that is formed on the sidewalls of the first ILD film 140, the insulating layer spacers 170 may be formed by anisotropically etching the insulating layer for spacing while protecting the first ILD film 140 and the insulating layer for spacing that is formed on the sidewalls of the first ILD film 140.

FIGS. 4A through 4E are cross-sectional views taken along line III—III of FIG. 1, which illustrate a structure at intermediate process steps according to a second embodiment of the present invention.

Figure 4A:
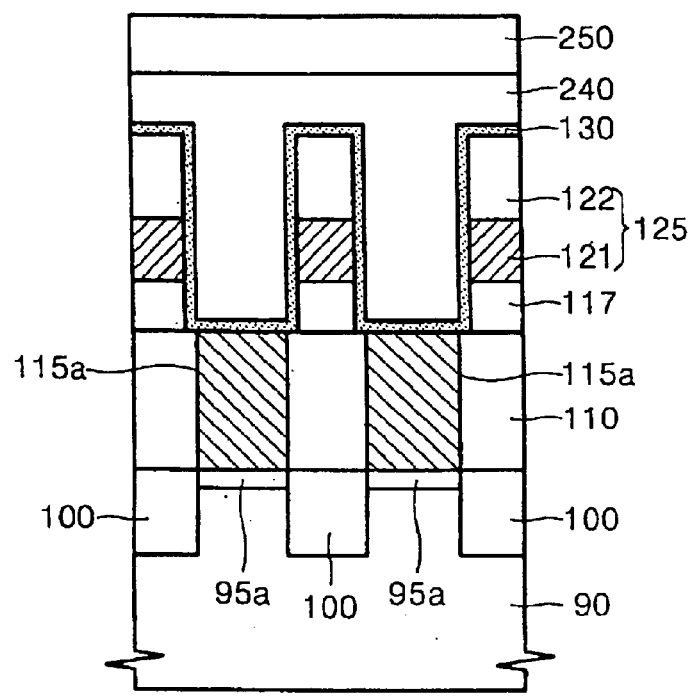
FIGS. 4A through 4E are cross-sectional views taken along line III—III of FIG. 1, which illustrate the structure at an intermediate process steps according to a second embodiment of the present invention.

As described in the first embodiment with reference to FIGS. 2A through 2C and FIGS. 3A through 3C, the cell pads 115a and 115b, the bit line contact plugs 120, the bit lines 125, and the bit line protection layer 130 are formed on the semiconductor substrate 90. As shown in FIG. 4A, the resultant structure including the bit lines 125 are covered by the bit line protection layer 130. A first ILD film 240 having a flat top is formed on bit line protection layer 130 as having a thickness greater than the height of the bit lines 125. To do this, an insulating material is deposited or coated on bit line protection layer 130 as having a thickness greater than the height of the bit lines 125, and then the top of the insulating material is planarized through CMP. In such a case, as the thickness of the first ILD film 240 is larger than the height of the bit lines 125, an etch time is adjusted in consideration of the etch rate of the first ILD film 240. Subsequently, a second ILD film 250 having a wet etch rate smaller than that of the first ILD film 240 is formed on the first ILD film 240. The second ILD film 250 may be formed as having a thickness smaller than that of the first ILD film 240.

The first ILD film 240 and the second ILD film 250 may be formed by combination of arbitrary ILD films having different etch rate. As mentioned in the first embodiment, the first and second ILD films 240 and 250 may be formed of BSG, PSG or BPSG having different doping concentration of impurities, or the first ILD film 240 may be formed of BSG, PSG, or BPSG, and the second ILD film 250 may be formed of TEOS or of an oxide that is formed through HDP-CVD.

Figure 4B:
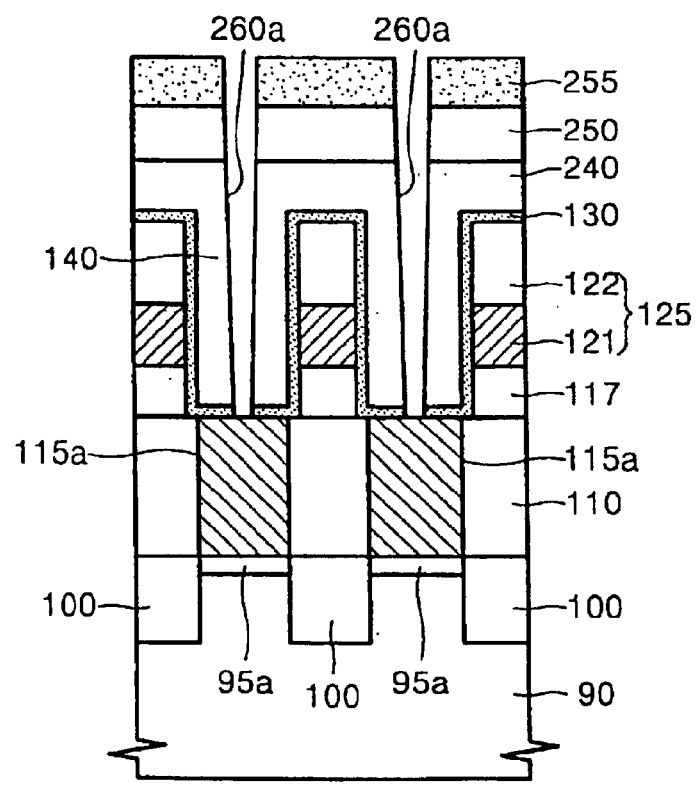

Referring to FIG. 4B, after a photoresist layer is formed on the second ILD film 250, a photoresist pattern 255 for defining an opening for exposing the cell pad 115a is formed through a photolithographic process. Subsequently, the second and first ILD films 250 and 240 and the bit line protection layer 130 are continuously etched in order using the photoresist pattern 255 as an etching mask, to thereby form storage node contact holes 260a having narrow width that expose the cell pad 115a. The storage node contact holes 260a are formed in the second and first ILD films 250 and 240, and the width of the storage node contact holes 260a is narrower at the lower end of the storage node contact holes 260a due to the large aspect ratio of the storage node contact holes 260a.

Figure 4C:
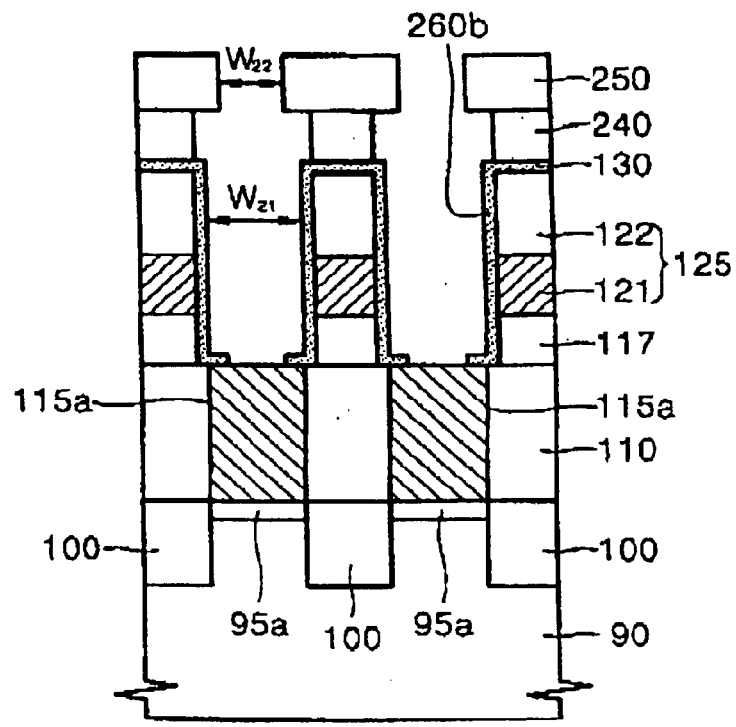

Referring to FIG. 4C, after the photoresist pattern 255 is removed, the second and first ILD films 250 and 240 are wet-etched, to thereby form storage node contact holes 260b having increased width. Since the etch rate of the first ILD film 240 is greater than that of the second ILD film 250, the lower width of each of the storage node contact holes 260b is increased relatively more than the upper width of each of the storage node contact holes 260b, so that lower width $W_{21}$ is greater than upper width $W_{22}$. In this case, the bit line protection layer 130 may be used as an etch stopper.

By increasing the lower width $W_{21}$ of each of the storage node contact holes 260b, a contact area between the conductive material, which is to be formed in the storage node contact holes 260b, and the lower cell pads 115a may be increased. Thus, an increase in contact resistance may be prevented. Even though the lower width $W_{21}$ of each of the storage node contact holes 260b is increased to a desired lower width, the etch rate of the second ILD film 250 is smaller than that of the first ILD film 240, and thus the upper width $W_{22}$ of each of the storage node contact holes 260b is not excessively increased. As a result, bridging of conductive materials that are to be buried in the adjacent storage node contact holes 260b may be prevented.

Figure 4D:
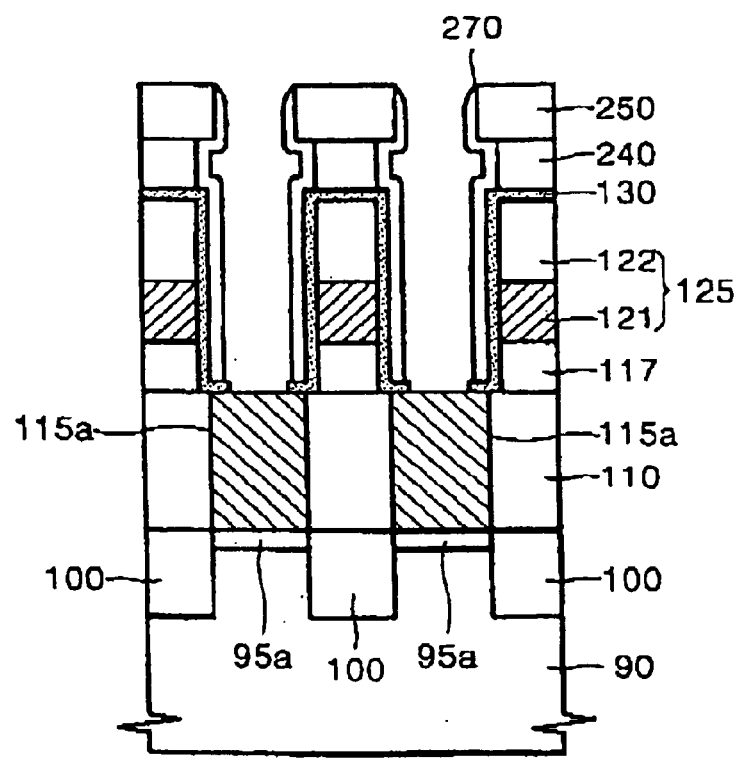

Referring to FIG. 4D, an insulating layer for spacing is formed on the resulting structure as having a thickness such that the storage node contact holes 260b are not buried. The insulating layer for spacing may have a high step coverage. For example, a nitride layer may be formed as having a thickness of 100–500 Å. Next, anisotropic etching such as etch back is performed, and the insulating layer for spacing is etched so that an insulating layer spacer 270 is formed on the internal walls of the storage node contact holes 260b. As shown in FIG. 4C, the upper width $W_{22}$ of each of the storage node contact holes 260b is relatively narrower than the lower width $W_{12}$ of each of the storage node contact holes 260b, and thus the first ILD film 240 and the insulating layer for spacing that is formed on the sidewalls of the first ILD film 240 cannot be seen from the top of the resultant structure. Thus, when the insulating layer for spacing is anisotropically etched for formation of the insulating layer spacers 270, the first ILD film 240 and the insulating layer for spacing that is formed on the sidewalls of the first ILD film 240 are protected from etching. The second ILD film 250 may be completely removed while the insulating layer for spacing is anisotropically etched for formation of the insulating layer spacers 270, or may be removed in the subsequent step.

Figure 4E:
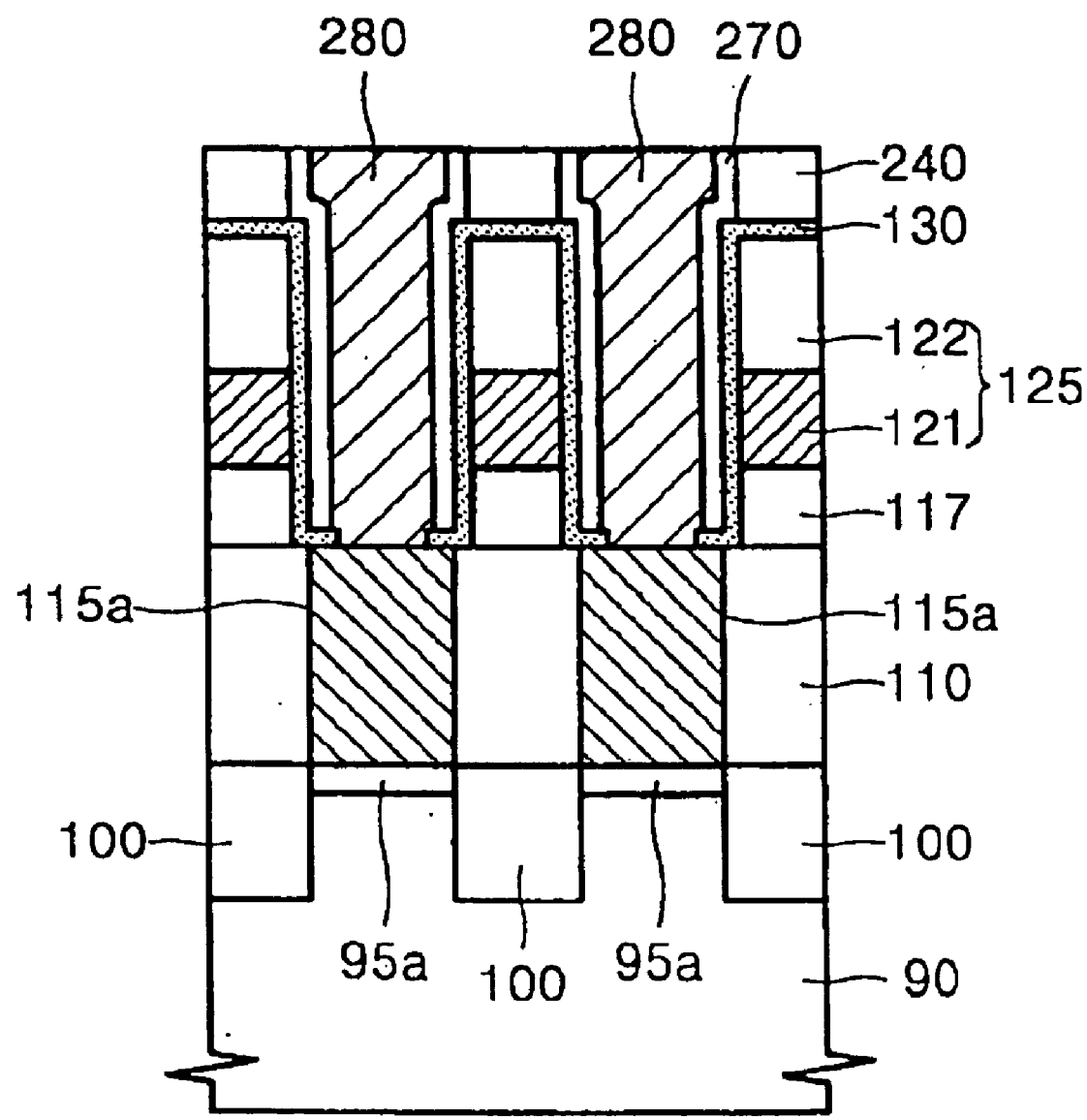

Referring to FIG. 4E, storage node contact plugs 280 that are separated from one another are formed by burying a conductive material in the storage node contact holes 260b. For this purpose, a conductive material is deposited on the resultant structure to completely bury the storage node contact holes 260b having the insulating layer spacer 270 formed on internal walls thereof. In a case where the second ILD film 250 is completely removed, the top of the resultant structure on which the conductive material is deposited is planarized until the first ILD film 240 is exposed. In the case where the second ILD film 250 is not removed, the top of the resultant structure on which the conductive material is deposited and the second ILD film 250 are removed until the first ILD film 240 is exposed. The second ILD film 250 has an exposure area of narrow width, and since the conductive material that is buried in the second ILD film 250 and the second ILD film 250 itself are removed, the width of the storage node contact plugs 280 is larger from an upper view of the structure. Thus, a contact area of storage nodes that are subsequently connected to storage node contact plugs 280 can be sufficiently obtained.

As described above, the storage node contact holes are formed using two ILD films having different wet etch rates. Since the ILD films having greater etching speed are formed on lower portions of the semiconductor substrate, when the width of the storage node contact holes is increased by wet etching the ILD films, the lower width of each of the storage node contact holes is increased relatively more than the upper width of each of the storage node contact holes. In a case where the separated storage node contact plugs are formed by burying the conductive material in the storage node contact holes having increased width, shorts between the storage node contact plugs and the bit lines may be avoided, and an increase in contact resistance with the storage node contact plugs can be prevented. Bridges between the adjacent storage node contact plugs can be prevented. Since an upper ILD film having smaller etch rate shadows or overhangs a lower ILD film having larger etch rate and the insulating layer for spacing that is formed on the sidewalls of the lower ILD film, the insulating layer spacers can be formed without loss of the insulating layer for spacing.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
   a substrate having cell pads formed thereon, the cell pads being separated from each other by insulation material;
   bit lines disposed on the substrate;

a bit line protection layer disposed on an entire surface of the semiconductor device including the bit lines and the substrate, the bit line protection layer having a thickness so that the bit lines are not buried;

a first interlevel dielectric (ILD) layer disposed on the bit line protection layer, the first ILD layer having a thickness such that areas between the bit lines are buried and the bit line protection layer on top surfaces of the bit lines is exposed;

a second interlevel dielectric (ILD) layer disposed on the first ILD layer and the exposed bit line protection layer;

storage node contact holes disposed in between the bit lines through the second and first ILD layers and the bit line protection layer to the cell pads, a lower width of the storage node contact holes through the first ILD layer being greater than an upper width of the storage node contact holes through the second ILD layer; and a conductive material buried within the storage node contact holes.

2. The semiconductor device of claim 1, wherein the first ILD film is an insulating material in which impurities are doped with a first concentration, and the second ILD film is the insulating material in which impurities are doped with a second concentration lower than the first concentration.

3. The semiconductor device of claim 2, wherein the insulating material is boron silicate glass (BSG), phosphorus silicate glass (PSG), or boron phosphorus silicate glass (BPSG).

4. The semiconductor device of claim 1, wherein the first ILD film is BSG, PSG, or BPSG, and the second ILD film is tetra ethyl ortho silicate (TEOS) or a high density plasma-chemical vapor deposition (HDP-CVD) oxide.

5. The semiconductor device of claim 1, wherein the bit line protection layer is an etch stopper for the first ILD film.

6. The semiconductor device of claim 5, wherein the bit line protection layer is silicon nitride.

7. The semiconductor device of claim 1, wherein a wet etch rate of the first ILD layer is greater than a wet etch rate of the second ILD layer.

8. The semiconductor device of claim 1, further comprising insulating layer spacers disposed on internal sidewalls of the storage node contact holes, the conductive material being buried within the storage node contact holes on the insulating layer spacers.

9. The semiconductor device of claim 8, wherein the bit line protection layer is disposed entirely on internal sidewalls of the contact holes from a top to a bottom thereof.

10. The semiconductor device of claim 1, wherein the bit lines are sequentially stacked layers comprising a bit line conductive layer and a capping layer.

11. The semiconductor device of claim 1, wherein the first ILD layer is thicker than the second ILD layer.

12. The semiconductor device of claim 1, wherein a top surface of the first ILD layer is parallel with a top surface of the bit line protection layer.

13. The semiconductor device of claim 1, wherein the conductive material fills the contact holes and has a planar top surface.

14. A semiconductor device comprising:

a substrate;

cell pads disposed on the substrate, the cell pads being separated from each other by an insulation material;

bit lines disposed above the substrate at a layer above the cell pads;

a bit line protection layer disposed on the bit lines and the substrate, the bit line protection layer having a thickness so that the bit lines are not buried;

a first interlevel dielectric (ILD) layer disposed on a portion of the bit line protection layer, the first ILD layer burying areas between the bit lines and exposing the bit line protection layer on top surfaces of the bit lines;

a second interlevel dielectric (ILD) layer disposed on the first ILD layer and the exposed bit line protection layer so as to directly contact the bit line protection layer on the top surfaces of the bit lines;

storage node contact plugs formed of a conductive material and disposed in between the bit lines, extending downward through the second and first ILD layers and the bit line protection layer to contact the cell pads, wherein a lower width of the storage node contact holes through the first ILD layer is greater than an upper width of the storage node contact holes through the second ILD layer.

15. The semiconductor device of claim 14, wherein the first ILD film is an insulating material in which impurities are doped with a first concentration, and the second ILD film is the insulating material in which impurities are doped with a second concentration lower than the first concentration.

16. The semiconductor device of claim 14, wherein a wet etch rate of the first ILD layer is greater than a wet etch rate of the second ILD layer.

17. The semiconductor device of claim 14, wherein a top surface of the first ILD layer is parallel with a top surface of the bit line protection layer.

18. The semiconductor device of claims 14, wherein the storage node contact plugs each have a planar top surface.

19. The semiconductor device of claim 14, wherein the bit line protection layer is disposed entirely on internal sidewalls of the contact holes from a top to a bottom thereof.

20. The semiconductor device of claim 14, wherein the cells pads each have a planar top surface.

* * * * *